(12) United States Patent
Huang et al.

(10) Patent No.: US 10,522,551 B2
(45) Date of Patent: Dec. 31, 2019

(54) SEMICONDUCTOR DEVICE AND SEMICONDUCTOR APPARATUS

(71) Applicant: United Microelectronics Corp., Hsinchu (TW)

(72) Inventors: Chun-Hsien Huang, Tainan (TW); Ching-Cheng Lung, Tainan (TW); Yu-Tse Kuo, Tainan (TW); Chang-Hung Chen, Tainan (TW); Shu-Ru Wang, Taichung (TW); Wei-Chi Lee, Tainan (TW); Chun-Yen Tseng, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/884,063

(22) Filed: Jan. 30, 2018

(65) Prior Publication Data

US 2019/0206879 A1    Jul. 4, 2019

(30) Foreign Application Priority Data

Jan. 3, 2018  (CN) .......................... 2018 1 0005924

(51) Int. Cl.
| | | |
|---|---|---|
| *H01L 27/11* | (2006.01) |
| *H01L 27/092* | (2006.01) |
| *G11C 11/41* | (2006.01) |
| *H01L 23/522* | (2006.01) |
| *H01L 27/02* | (2006.01) |

(52) U.S. Cl.
CPC .......... *H01L 27/1104* (2013.01); *G11C 11/41* (2013.01); *H01L 23/5226* (2013.01); *H01L 27/0207* (2013.01); *H01L 27/0924* (2013.01); *H01L 27/1116* (2013.01)

(58) Field of Classification Search
None
See application file for complete search history.

(56) References Cited

U.S. PATENT DOCUMENTS

| | | | |
|---|---|---|---|
| 9,196,352 B2 | 11/2015 | Hung et al. | |
| 9,721,841 B1 | 8/2017 | Wang et al. | |
| 2015/0069486 A1* | 3/2015 | Park ................. | H01L 27/11521 257/315 |
| 2016/0329314 A1* | 11/2016 | Kang ................. | H01L 21/76895 |

OTHER PUBLICATIONS

Chairpersons: Y.-C. Yeo, et al., "2017 Symposium on VLSI Technology Digest of Technical Papers," Session 6 Highlight, Jun. 7, 2017, pp. T67-T75.

* cited by examiner

*Primary Examiner* — Long Pham
(74) *Attorney, Agent, or Firm* — J.C. Patents

(57) ABSTRACT

A semiconductor device includes a first circuit structure and a second circuit structure. The first circuit structure has a first line terminal. The second circuit structure has a second line terminal. The first line terminal and the second line terminal are formed in a first circuit layer but separated by a gap. A conductive structure is forming in a second circuit layer above or below the first circuit layer, to electrically connect the first line terminal and the second line terminal.

18 Claims, 7 Drawing Sheets

SEMICONDUCTOR DEVICE AND SEMICONDUCTOR APPARATUS

CROSS-REFERENCE TO RELATED APPLICATION

This application claims the priority benefit of China application serial no. 201810005924.9, filed on Jan. 3, 2018. The entirety of the above-mentioned patent application is hereby incorporated by reference herein and made a part of this specification.

BACKGROUND

1. Field of the Invention

The present invention generally relates to semiconductor fabrication, and particularly to structure of semiconductor device and semiconductor apparatus.

2. Description of Related Art

The circuit structure of semiconductor device usually includes a number of element parts. These element parts are respectively electrically connected together to form a full circuit structure.

Taking the memory cell of a memory apparatus as an example, such as the structure of statistic random access memory (SRAM), it is a basic structure formed by six transistors. These six transistors are usually called as 6T. If the interface port is added in the circuit design, such as a read port or a connection port, the transistor includes not only the 6T but also the transistors for the interface port. In an example, it is a circuit of 8T/10T SRAM. The gate line of the transistors of these interface ports is connected to the circuit of 6T main body. The structure of the 6T is symmetric. However, if the circuit is added with the interface port, the layout of the gate line at the portion for external connection would not be symmetric. This causes an effect to in operation performance.

Further as to one gate line, in circuit structure, it also provides a connection to the gate terminals of the related transistors. Generally, the gate line is cut into multiple gate segments. Each gate segment is connected with multiple transistors. Thus, to the transistor array, the original gate line is connected with multiple transistors, and then the original gate line is cut to form a multiple connection groups.

When the gate line is cut, the physical stress would occur, which further influence the conductive property of the semiconductor material of the transistors at the near region to the cut and then influence the electric functionality. According to the actual research about conductivity, the operation performance of the transistor as connected to the gate line is indeed influenced when the gate line is cut. Thus, for the structure of 6T SRAM above, if the gate line is extended to connect to the read port, it causes the different performance of the transistors in operation. The operation performance of the 6T SRAM is reduced.

To the transistors of SRAM above, if the transistors are formed by fin field effect transistors, the influence as caused by cutting the gate line or breaking the symmetry of the circuit would be more observable.

It is still an issue as concerned in development about how to reduce the factors to cause the change of electric property when gate line is extended to connect out.

SUMMARY OF THE INVENTION

The invention is related to the structures about semiconductor device and semiconductor apparatus, capable of maintaining the external electric connection of the gate line, but the gate line can be cut at the intended location, so to keep the electric symmetric at the involved portion and maintain the operation performance.

According to an embodiment, the invention provides a semiconductor device, including a first circuit structure and a second circuit structure. The first circuit structure has a first line terminal. The second circuit structure has a second line terminal. The first line terminal and the second line terminal are formed in a first circuit layer but separated by a gap. A first conductive structure is formed in a second circuit layer above or below the first circuit layer, to electrically connect the first line terminal and the second line terminal.

According to an embodiment, as to the semiconductor device, the first circuit structure has a symmetric layout, the second circuit structure is a connection port and connected to the first circuit structure through the first conductive structure.

According to an embodiment, as to the semiconductor device, the first circuit structure and the second circuit structure are electrically connected through the first conductive structure, so to form a statistic random access memory (SRAM) cell, wherein the first line terminal is a first gate line terminal, the second line terminal is a second gate line terminal.

According to an embodiment, as to the semiconductor device, the first circuit structure comprises a 6-tranststor (6T) SRAM structure, and the second circuit structure is a single read port, having two transistors.

According to an embodiment, as to the semiconductor device, the first circuit structure comprises a 6-tranststor (6T) SRAM structure, and the second circuit structure has multiple connection ports, each of the connection ports is electrically connected to the first gate line terminal of the first circuit structure through the first conductive structure.

According to an embodiment, as to the semiconductor device, the first circuit structure further comprises a third gate line terminal, to be electrically connected to an adjacent SRAM cell, wherein the second circuit layer further comprises a second conductive structure electrically connecting the third gate line terminal of the SRAM cell and the adjacent SRAM cell.

According to an embodiment, as to the semiconductor device, the first circuit structure and the second circuit structure respectively comprise a plurality of fin field effect transistors.

According to an embodiment, as to the semiconductor device, the first circuit structure has a symmetric layout, the second circuit structure is a connection port and electrically connected to the first circuit structure through the first conductive structure.

According to an embodiment, as to the semiconductor device, the first circuit structure and the second circuit structure are electrically connected through the first conductive structure, so to form a statistic random access memory (SRAM) cell, wherein the first line terminal is a first gate line terminal, the second line terminal is a second gate line terminal.

According to an embodiment, as to the semiconductor device, the first circuit structure comprises a 6-tranststor (6T) SRAM structure, wherein the second circuit structure has a single connection port or the second circuit structure has multiple connection ports, each connection port is electrically connected to the first gate line terminal of the first circuit structure through the first conductive structure.

According to an embodiment, as to the semiconductor device, the first circuit structure further comprises a third gate line terminal, to be electrically connected to an adjacent SRAM cell, wherein the second circuit layer further comprises a second conductive structure electrically connecting the third gate line terminal of the SRAM cell and the adjacent SRAM cell.

According to an embodiment, as to the semiconductor device, the first conductive structure is a conductive plug.

According to an embodiment, the invention provides a semiconductor apparatus. The semiconductor apparatus comprises a substrate, having a plurality of fin lines, formed by a protruding portion of the substrate, wherein the fin lines are extending along a first direction. A plurality of gate line segments is crossing over the fin lines of the substrate, wherein the gate line segments are configured into multiple parallel lines, extending along a second direction perpendicular to the first direction. A conductive structure is disposed above or under adjacent two of the gate line segments, so to electrically connect the adjacent two of the gate line segments.

According to an embodiment, as to the semiconductor apparatus, the semiconductor apparatus is a statistic random access memory (SRAM) apparatus, comprises a plurality of SRAM cells, each SRAM cell is accordingly formed by the gate line segments, the fin lines and the conductive structure.

According to an embodiment, as to the semiconductor apparatus, each SRAM cell comprises a first circuit structure and a second circuit structure electrically connected by the conductive structure, each of the first circuit structure and the second circuit structure comprises a plurality of fin field effect transistors.

According to an embodiment, as to the semiconductor apparatus, the first circuit structure has a symmetric layout, the second circuit structure is a connection port and connected to the first circuit structure through the first conductive structure.

According to an embodiment, as to the semiconductor apparatus, the first circuit structure and the second circuit structure are electrically connected through the conductive structure, so to form a corresponding one of the SRAM cells.

According to an embodiment, as to the semiconductor apparatus, the first circuit structure comprises a 6-tranststor (6T) SRAM structure, and the second circuit structure is a single read port, having two transistors.

According to an embodiment, as to the semiconductor apparatus, the first circuit structure comprises a 6-tranststor (6T) SRAM structure, and the second circuit structure has multiple connection ports, each of the connection ports is electrically connected to the first circuit structure through the first conductive structure.

According to an embodiment, as to the semiconductor apparatus, the first conductive structure is a conductive plug.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
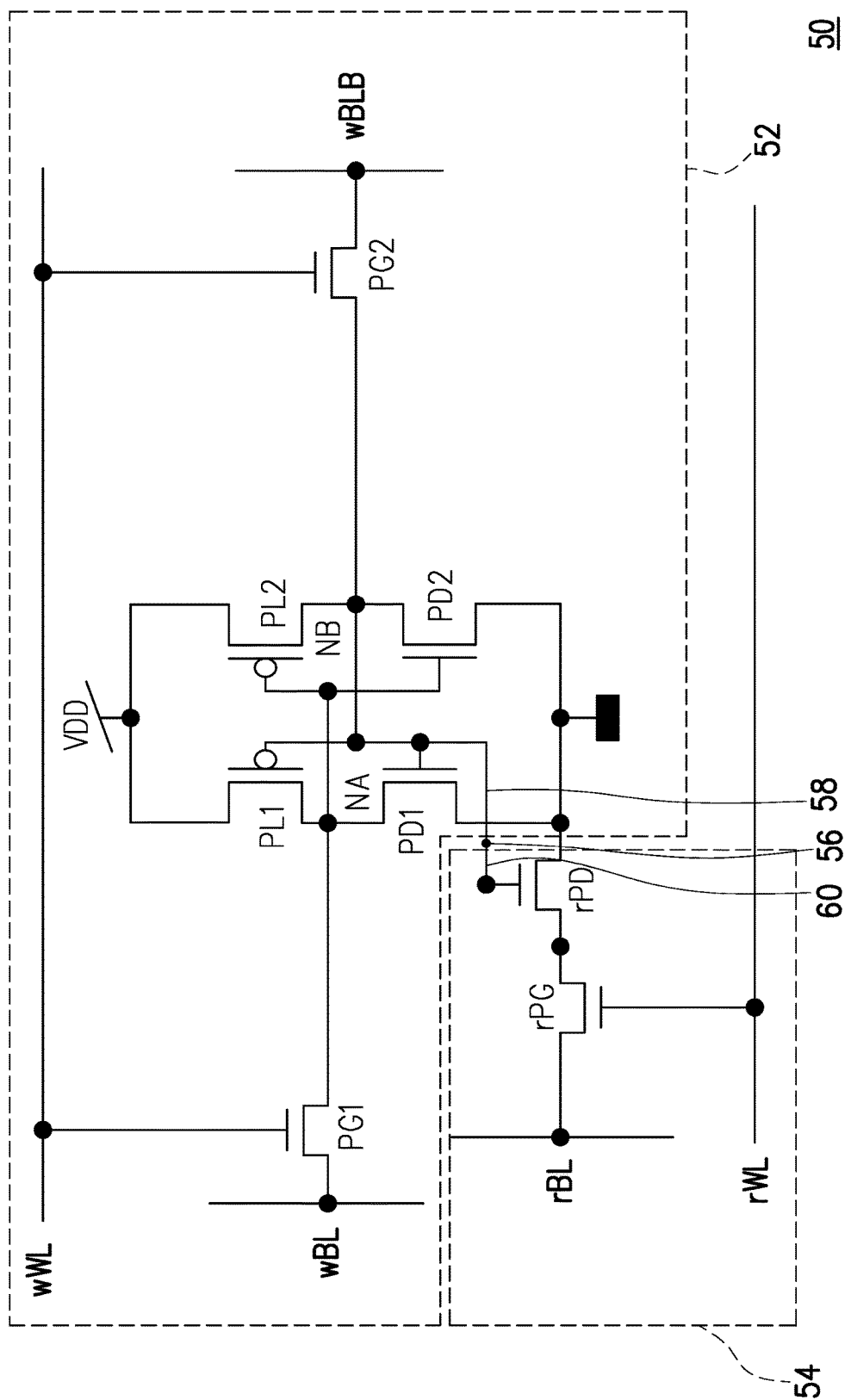
FIG. 1 is a drawing, schematically illustrating a circuit structure of 8T SRAM cell, according to an embodiment of the invention.

Some other embodiments of the invention are provided as follows. It should be noted that the reference numerals and part of the contents of the previous embodiment are used in the following embodiments, in which identical reference numerals indicate identical or similar components, and repeated description of the same technical contents is omitted. Please refer to the description of the previous embodiment for the omitted contents, which will not be repeated hereinafter.

The invention is directed to structure of semiconductor device and semiconductor apparatus, capable of maintaining the subsequent connection structure for the gate line, but the gate line is cut at the intend location, so that the symmetric property for the involved portion of the circuit can be maintained and operation performance remains.

The application of the invention on 6T/8T/10T SRAM structure in an example can effectively maintain the symmetric connection for the 6 transistors in 6T structure.

Several embodiments are provided to describe the invention, but the invention is not just limited to the embodiments provided.

FIG. 1 is a drawing, schematically illustrating a circuit structure of 8T SRAM cell, according to an embodiment of the invention. In FIG. 1, the 8T SRAM circuit 50 is taken as an example for investigating the issues as concerned. The 8T SRAM circuit 50 is based on a 6T SRAM circuit 52. Additionally, it is further implemented with a read port circuit 54. As viewed from the circuit, the 6T SRAM circuit 52 is a symmetric structure, including two P-type transistors PL1, PL2 and two N-type transistors PD1, PD2, which form two ant-parallel inverters between the node NA and the node NB. Further, it includes two N-type transistors PG1, PG2, serving as switches.

The device layout of 6T SRAM circuit 52 in semiconductor fabrication technology would arrange, according to electric property, the two P-type transistors PL1, PL2 are disposed over the same N-type well. A P-type well at one side of the N-type well is implemented with the transistor PD1 and the transistor PG1. A P-type well at another side of the N-type well is implemented with the transistor PD2 and the transistor PG2. Thereby, the 6 transistors are symmetrically disposed. The layout structure of the semiconductor device would be described in better detail later.

In operation, the gate terminals of the transistor PG1 and transistor PG2 are controlled by the write word line. The write word line is represented by wWL. The source/drain terminals of the transistor PG1 and transistor PG2 are respectively controlled by write bit line and the complementary write bit line. The write bit line is represented by wBL and the complementary write bit line is represented by wBLB.

The design of 8T SRAM circuit 50 further includes the read port circuit 54, which includes the transistors rPG and rPD. The transistor rPG serves as a switch as controlled by the read bit line rBL and the read word line rWL. The transistor rPD is connected to the node NA of the 6T SRAM circuit 52. In other words, the node NA is connected to the gate terminals of the transistor rPD, transistor PL1 and transistor PD1, so that they are usually connected by the same gate line in the fabrication. As the circuit connected to the node 56, the line terminal 60 of the read pot circuit 54 and the line terminal 58 of the 6T SRAM circuit 62 are connected at the node 56.

If the gate terminals of the transistor rPD, transistor PL1, the transistor PD1 are connected by a single gate line as usual way, the gate line of the transistor PD1 with respect to the transistor PD2 at breaking state would cause a difference in electric property, in which the symmetry in operation cannot be maintained. The layout difference will be described in FIG. 4 and FIG. 5 in better detail.

After at least considering the above issues, the invention has proposed a connection for the gate terminals of the transistor rPD, the transistor PL1 and the transistor PD1. The connection of the gate line for connecting the transistor PD1 with respect to the transistor PD2 can have better symmetric status.

Figure 2:
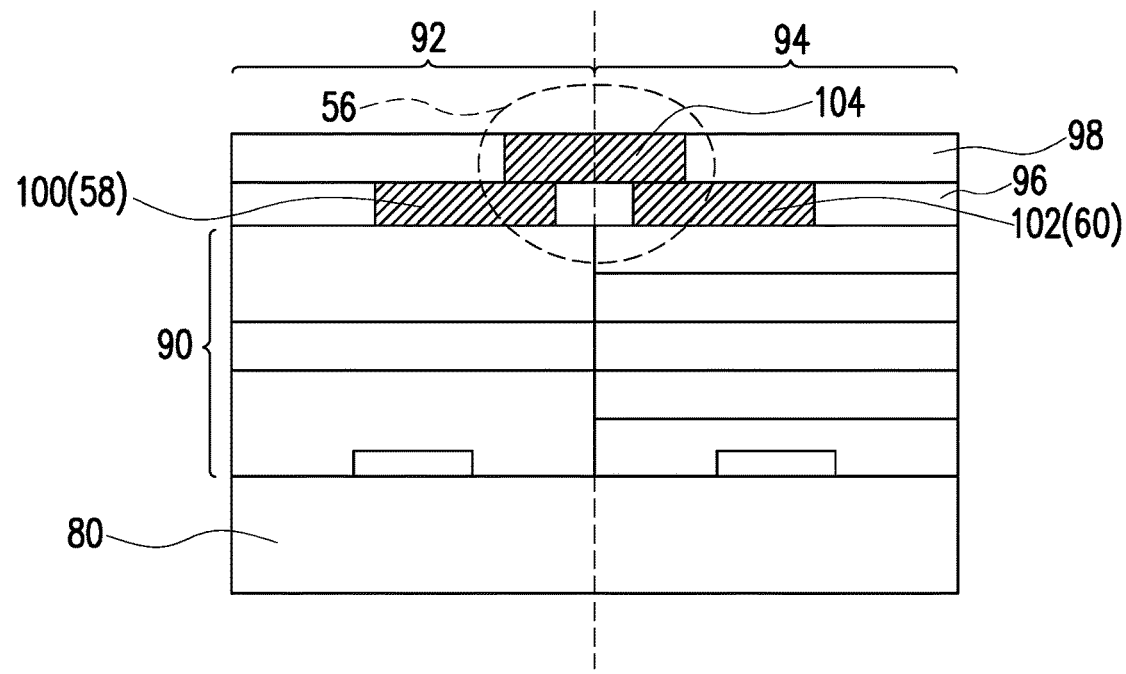
FIG. 2 is a drawing, schematically illustrating a cross-sectional structure of the connection mechanism between two circuit structures, according to an embodiment of the invention.

FIG. 2 is a drawing, schematically illustrating a cross-sectional structure of the connection mechanism between two circuit structures, according to an embodiment of the invention. In FIG. 2, as to the semiconductor fabrication, the circuit stacked layer 90 is formed on the substrate 80. The circuit stacked layer 90 at least includes the portions for the first circuit structure 92 and a second circuit structure 94. The first circuit structure 92 in an example can be the 6T SRAM circuit 52 in FIG. 1. The second circuit structure 94 in an example can be the read port circuit 54 in FIG. 1.

In general, the first circuit structure 92 has a first line terminal 100. The second circuit structure 94 has a second line terminal 102. The first line terminal 100 and the second line terminal 102 are formed in the first circuit layer 96, but separated by gap. The conductive structure 104 is formed in the second circuit layer 98 over the first circuit layer 96, electrically connecting the first line terminal 100 and the second line terminal 102. The conductive structure 104 in an example can be the structure of contact plug, to have electric connection of the first line terminal 100 and the second line terminal 102. Taking the structure of FIG. 1 as an example, the first line terminal 100 is a breaking state at the region of node 52. The first line terminal 100 and the second line terminal 102 in an example are gate line structures.

Figure 3:
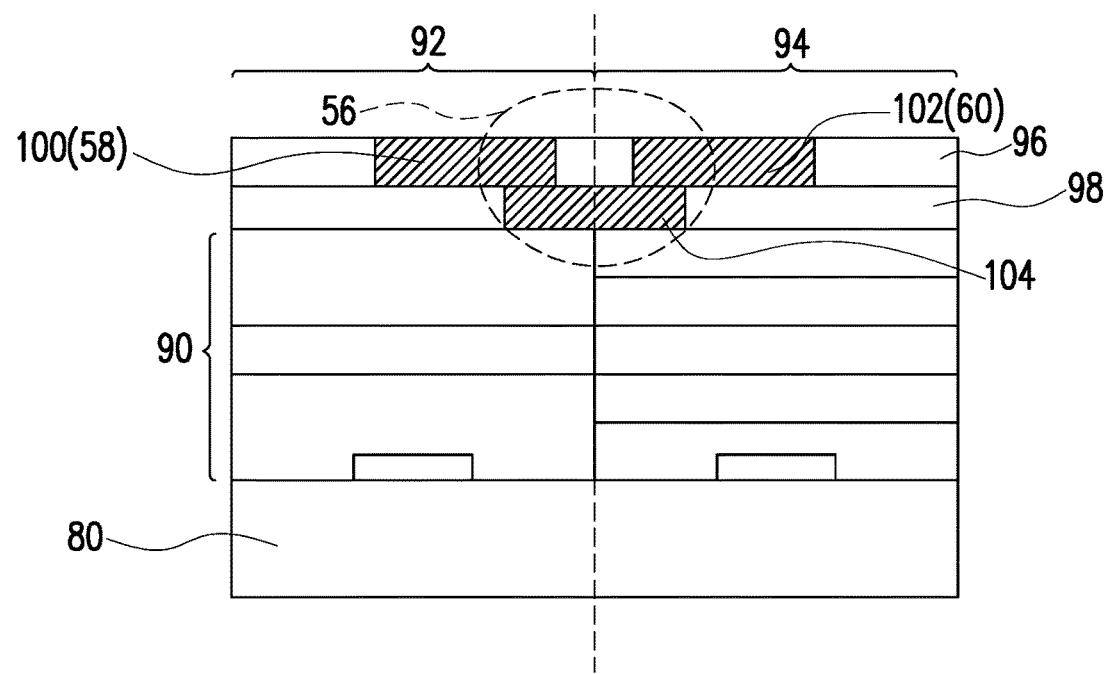
FIG. 3 is a drawing, schematically illustrating a cross-sectional structure of the connection mechanism between two circuit structures, according to an embodiment of the invention.

FIG. 3 is a drawing, schematically illustrating a cross-sectional structure of the connection mechanism between two circuit structures, according to an embodiment of the invention. In FIG. 3, based on the similar features in FIG. 2, the conductive structure 104 can be located under the first circuit layer 96. The conductive structure 104 can be formed in the circuit layer 98 beforehand.

Further, in fabrication of device, the intended structures for the device and the connection of the circuit, it usually includes an inter-dielectric layer in auxiliary use, in which the inter-dielectric layer includes multiple stacked layers. This is known in the art and is not further described in detail.

Figure 4:
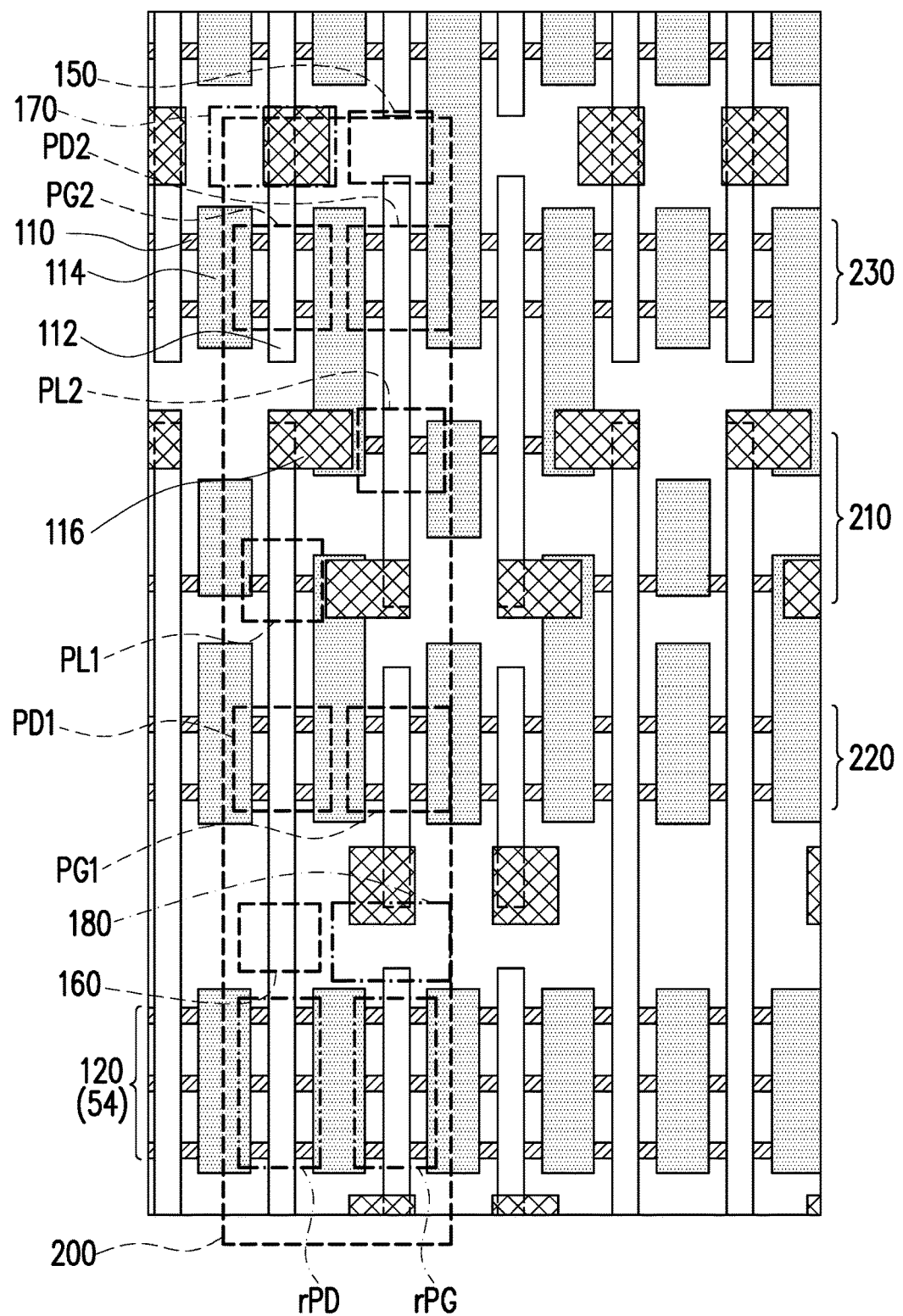
FIG. 4 is a drawing, schematically illustrating a layout structure for 8T SRAM cell, according to an embodiment of the invention.

FIG. 4 is a drawing, schematically illustrating a layout structure for 8T SRAM cell, according to an embodiment of the invention. In FIG. 4, as to the circuit with respect to FIG. 1, if it is formed by fin field effect transistor (FinFET) in an example, the invention has looked into and made research on the conventional layout and stated the issues in the layout structure, which could possibly occur.

If the six transistors of the SRAM cell 200 are formed by FinFET, a plurality of fin lines 110 are formed on the substrate, which are in parallel and extending along a direction. The gate line segments 112 extends along another direction, perpendicular to the fin lines 110 and crosses over the corresponding fin lines 110. The region of the gate line segments 112 in contacting with the fin lines 110 is serving as the gate terminal of the transistor, in which the gate insulating layer at the bottom is not substantially shown. The other portion of the gate line segments 112 is used as the route for connecting the gate terminals. The 6T SRAM circuit 52 includes two P-type transistors PL1, PL2, disposed on the same N-type well 210. Two transistors PD1 and PG1 are disposed on a P-type well 220 at one side of the N-type well 210. Two transistors PD2 and PG2 are disposed on another P-type well 230 at another side of the N-type well 210.

As to the usual design, the gate terminal of the N-type transistor is formed of multiple fin lines 110, such as two fin lines in an example. However, the invention is not limited to this number. It can be single fin line or multiple fin lines.

When the SRAM cell 20 is a 8T structure in an example, the two transistors of the read port circuit 54 are formed in the circuit region 120, in which one transistor may be formed, including three fin lines 110 as an example.

Here, the gate terminals of the transistor rPD, transistor PL1, transistor PD1 need to be electrically connected. If a single gate line segment 112 is used for the connection, the circuit region 160 between the gate terminal of the transistor PD1 and the read port circuit 54 has the continuous gate line segment 112. With respect to the transistor PD2, the gate terminal need no further outward connect, the circuit region 150 of the gate line segment is cut in breaking status.

The contacting structure 114 is also disposed between the gate line segments 112, as usually known, for allowing to apply the operation voltages. No description in detail is provided here.

In operation performance, after the investigation with actual measurement in the invention, the transistor PD1 with respect to the transistor PD2 in operation performance is better. However, in the ideal design for the 6T SRAM cell, the symmetric operation is usually required. As a result, the raise of operation for the transistor PD1 on the other hand would cause the asymmetric operation.

In addition to the issue of asymmetric operation between the transistor PD1 and transistor PD2, the similar issue also occurs between the transistor PG1 and the transistor PG2.

Still referring to FIG. 4, since the read port circuit 54 is disposed on one side of the transistor PG1, the gate line of the transistor PG1 at the circuit region 180 is cut, and is separate from the read port circuit 54. With respect to the transistor PG1, the gate line of the transistor PG2 at the circuit region 170 is connected to the next SRAM cell. The gate line remains without cutting. After the investigation with actual measurement in the invention, the operation performance of the transistor PG1 get worse and then is not consistent with the operation performance of the transistor PG2.

As the research on the SRAM cell 200, the operation performance for the transistor would have difference due to whether or not cutting the gate line. When the requirement of symmetric operation is higher than the individual operation performance, the single gate line in use would destruct the symmetric operation. The invention proposes the connection structure as shown in FIG. 2 and FIG. 3 in an example, the fabrication process is compatible with the formation of the contact structure as originally required in other location, without substantially adding the fabrication process. The fabrications cost does not substantially increase.

In considering the issue in FIG. 4, the embodiments, taking the technology in FIG. 2 and FIG. 3, so to cut the gate line for keeping the symmetric requirement, but the conductive structure 104 is used to implement the electric connection as actually needed.

Figure 5:
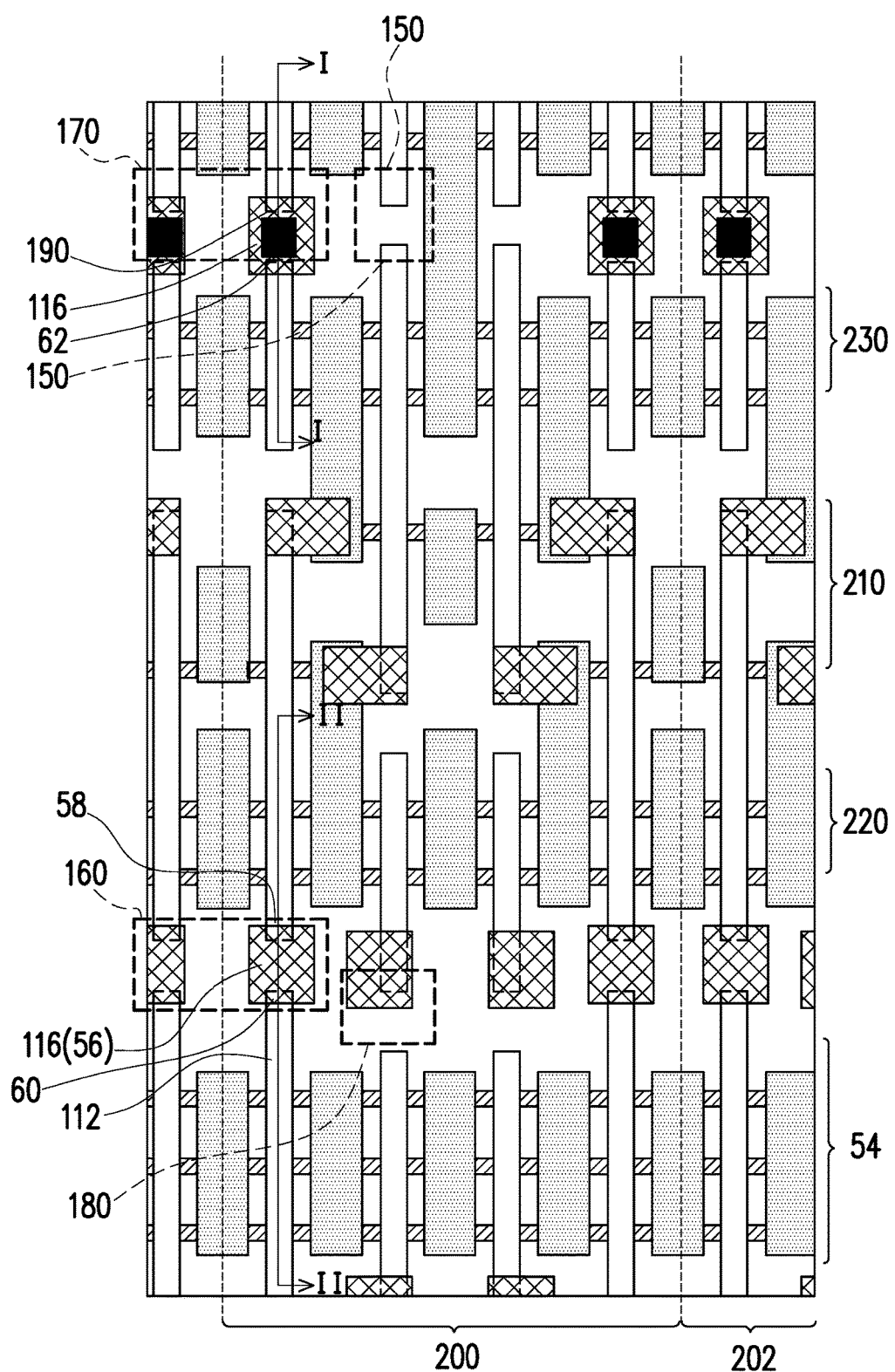
FIG. 5 is a drawing, schematically illustrating a layout structure for 8T SRAM cell, according to an embodiment of the invention.

FIG. 5 is a drawing, schematically illustrating a layout structure for 8T SRAM cell, according to an embodiment of the invention. In FIG. 5 as an embodiment, the gate line segment 112 at the circuit region 160 is cut, but the conductive structure 116 is formed at the same time for forming the contact structure 114 at subsequent process. The conductive structure 116 within the circuit region 160 serves as the node 56 to maintain the electric connection. The conductive structure 116 at the other regions serves as receiving the operation voltages. In other words, the conductive structure 116 can also be the structure for a contact plug. However, it is the limitation. In an example, it can also be a polysilicon conductive layer.

Here, the gate line segment 112 of the circuit region 160 and the gate line segment 112 of the circuit region 150 are cut, so to maintain the symmetric property.

In addition, the gate line segment 112 of the circuit region 170 has another line terminal 62, needing to be connected to the adjacent 8T SRAM structure above, which can also have the cutting status, with respect to the gate line segment 112 of the circuit region 180. As a result, the operation performance for the transistor PG1 and transistor PG2 can maintain about the same, in approaching to symmetric property. The conductive structure 116 within the circuit region 170 can be applied with the voltage by the voltage terminal 190.

Further, since the contact structure 114 and the conductive structure 116 are at the same layer, the contact structure 114 within the circuit region 160 is adjacent to the conductive structure 116, so the contact structure 114 is cut, so to avoid the unintended connection between the adjacent two for the contact structure 114 and the conductive structure 116.

The adjacent SRAM cell 202 at the left/right side can also be fabricated by the same manner.

Figure 6:
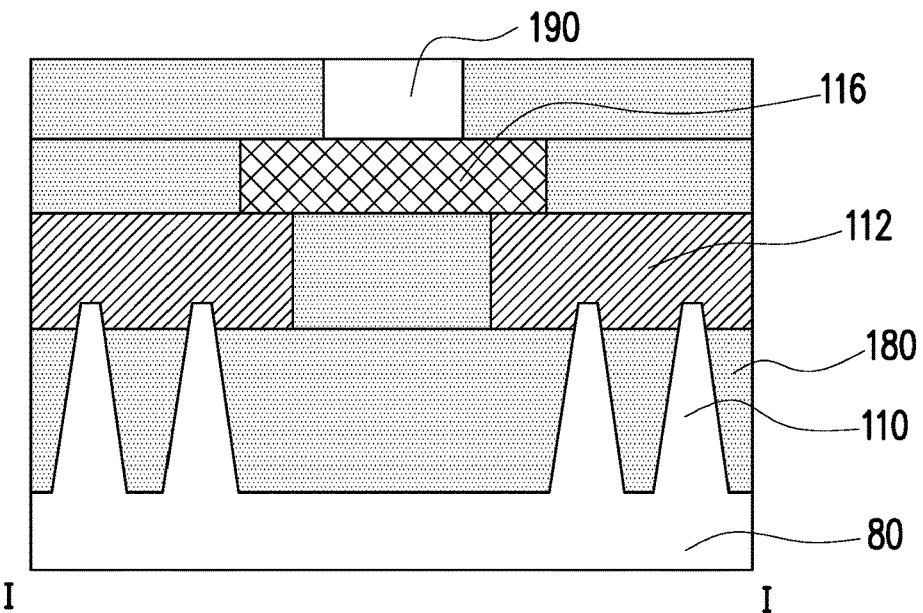
FIG. 6 is a drawing, schematically illustrating across-section structure cutting along the line I-I in FIG. 5, according to an embodiment of the invention.

FIG. 6 is a drawing, schematically illustrating across-section structure cutting along the line I-I in FIG. 5, according to an embodiment of the invention. In FIG. 6, as seen from the cross-sectional structure at the line I-I in FIG. 5, the gate line segment 112 is crossing over the fin line 110, but is cut with a gap within the circuit region 170. However, the conductive structure 116 in another layer within the circuit region 170 can connect the gate line segment 112 as being cut. The operation voltage can be applied through the voltage terminal 190. The dielectric material 180 is an insulating structure and is the residual portion after the fabrication process, which also serves as the insulation function without further descriptions.

Figure 7:
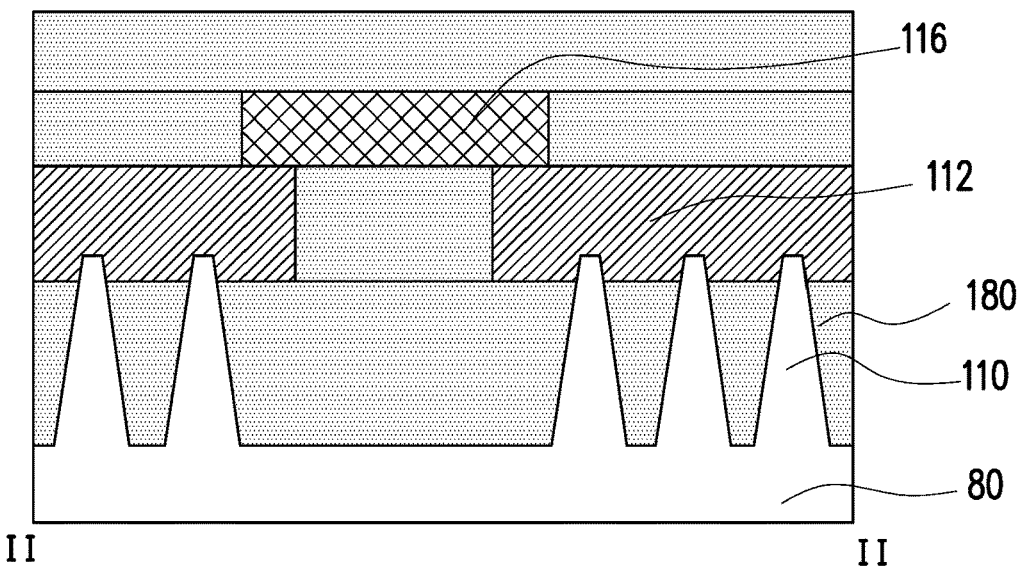
FIG. 7 is a drawing, schematically illustrating across-section structure cutting along the line II-II in FIG. 5, according to an embodiment of the invention.

FIG. 7 is a drawing, schematically illustrating across-section structure cutting along the line II-II in FIG. 5, according to an embodiment of the invention. In FIG. 7, as seen from the cross-sectional structure at the line II-II in FIG. 5, the gate line segment 112 is crossing over the fin line 110, but is cut with a gap within the circuit region 160. Likewise to FIG. 6, the conductive structure 116 within the circuit region 160 is used to connect the gate line segments 112 as being cut.

Figure 8:
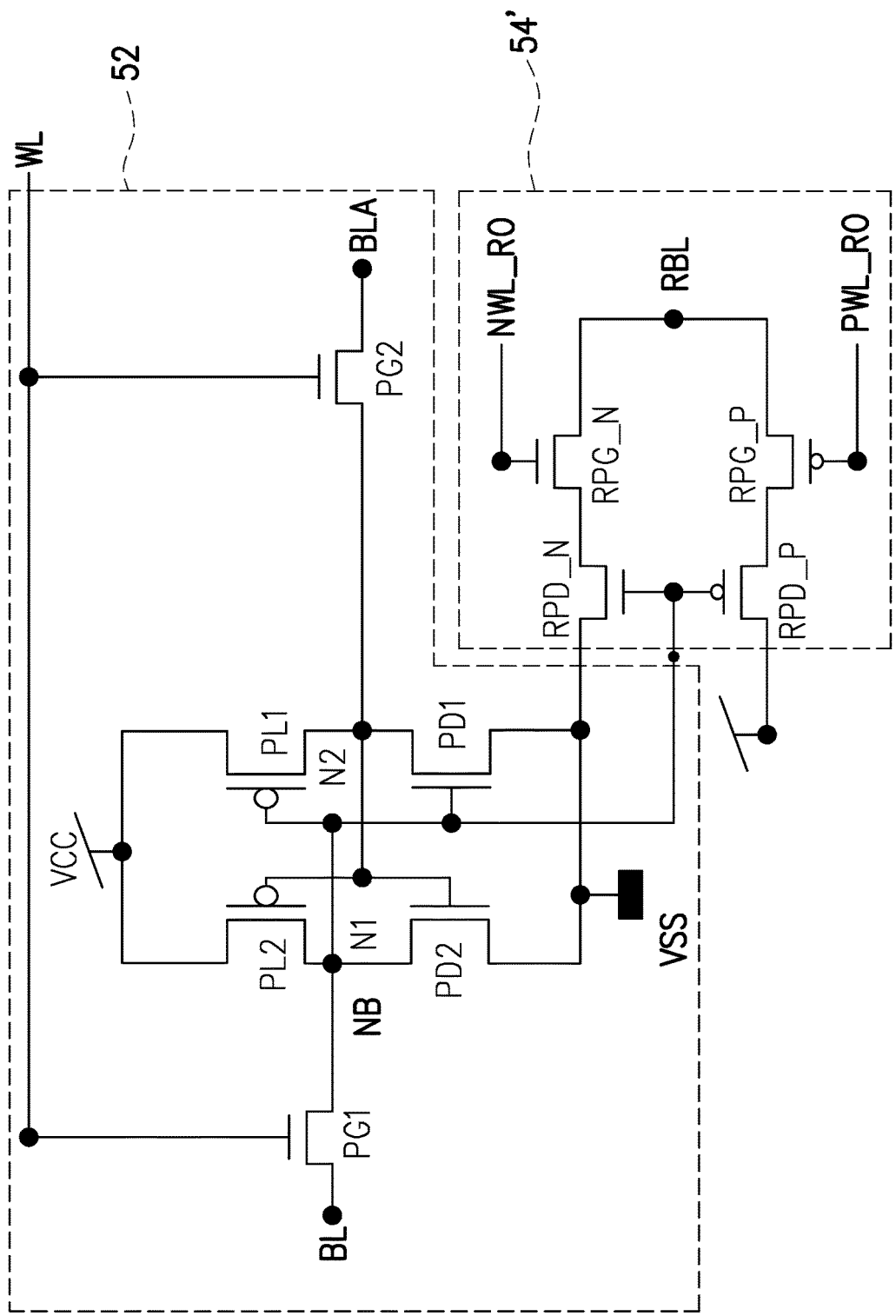
FIG. 8 is a drawing, schematically illustrating a circuit structure of 8T SRAM cell, according to an embodiment of the invention.

The invention can also be applied to the 10T SRAM circuit 50, as shown in FIG. 8, in which 6T SRAM circuit 52 is similar to FIG. 1. The read port circuit 54' is multiple routes, such as two routes. One route is formed by two N-type transistors RPD_N and RPG_N coupled in series. Another route is formed by two P-type transistors RPG_P and RPG_P, coupled in series.

The word line WL controls the gate terminals of the transistors PG1, PG2. The bit line is connected to the source/drain terminal. The invert bit line BLA is connected to source/drain terminal of the transistor PG2. The gate terminals of the transistor RPD_N and the transistor RPD_P are connected together with connection to the SRAM circuit 52 as shown in FIG. 1. Thus, the read port circuit 54' in the drawing is also formed with the circuit region 120. The read-out word line NWL_RO controls the gate terminal of the transistor RPG_N, the read-out word line PWL_RO controls the gate terminal of the transistor RPG_P. The read-out bit line RBL is connected to the source/drain region of the transistor RPG_N and the source/drain region of the transistor RPG_P.

Figure 9:
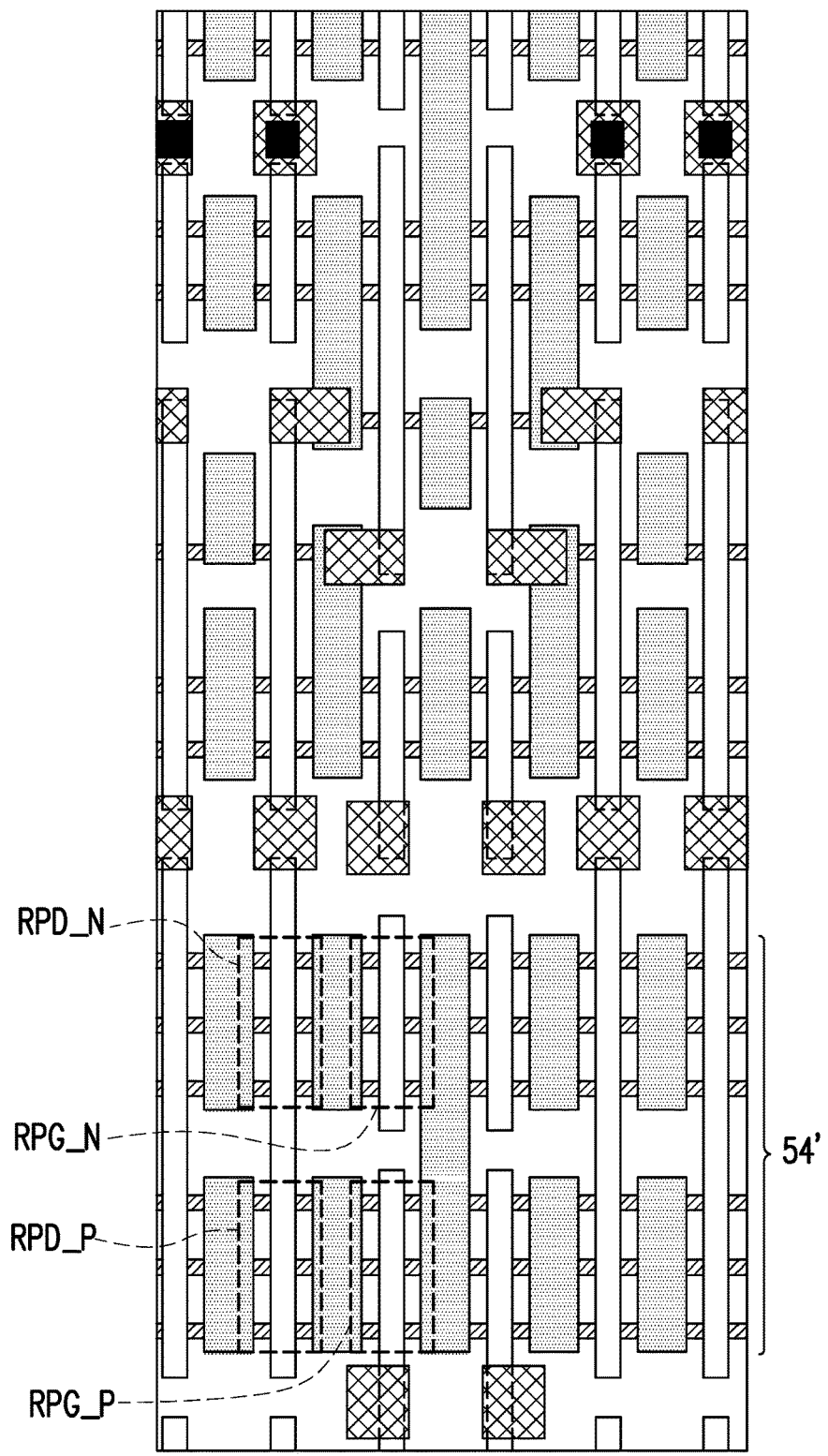
FIG. 9 is a drawing, schematically illustrating a layout structure for 10T SRAM cell, according to an embodiment of the invention.

FIG. 9 is a drawing, schematically illustrating a layout structure for 10T SRAM cell, according to an embodiment of the invention. In FIG. 9, according to the 10T SRAM circuit 50 in FIG. 8, the layout of the semiconductor structure is similar to FIG. 5 but the read port circuit 54' adds the transistor RPD_P and transistor RPG_P, in which the gate terminals of the transistor RPD_N and the transistor RPD_P are connected together for forming two routes. As shown in drawing in an example, it is extending at the horizontal direction.

The invention can be applied to the 8T/10T SRAM circuit 50 but also to the other two circuit structures for the connection between the line terminals, so to keep the electric connection and the physical stress can be changed, so to maintain the operation performance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
   a first circuit structure, having a first line terminal;
   a second circuit structure, having a second line terminal, wherein the first line terminal and the second line terminal are formed in a first circuit layer but separated by a gap; and
   a first conductive structure, formed in a second circuit layer above or below the first circuit layer, to electrically connect the first line terminal and the second line terminal,
   wherein the first circuit structure has a symmetric layout, the second circuit structure is a connection port and connected to the first circuit structure through the first conductive structure.

2. The semiconductor device of claim 1, wherein the first circuit structure and the second circuit structure are electrically connected through the first conductive structure, so to form a statistic random access memory (SRAM) cell, wherein the first line terminal is a first gate line terminal, the second line terminal is a second gate line terminal.

3. The semiconductor device of claim 2, wherein the first circuit structure comprises a 6-tranststor (6T) SRAM structure, and the second circuit structure is a single read port, having two transistors.

4. The semiconductor device of claim 2, wherein the first circuit structure comprises a 6-tranststor (6T) SRAM structure, and the second circuit structure has multiple connection ports, each of the connection ports is electrically connected to the first gate line terminal of the first circuit structure through the first conductive structure.

5. The semiconductor device of claim 2, wherein the first circuit structure further comprises a third gate line terminal, to be electrically connected to an adjacent SRAM cell, wherein the second circuit layer further comprises a second conductive structure electrically connecting the third gate line terminal of the SRAM cell and the adjacent SRAM cell.

6. The semiconductor device of claim 1, wherein the first circuit structure and the second circuit structure respectively comprise a plurality of fin field effect transistors.

7. The semiconductor device of claim 6, wherein the first circuit structure has a symmetric layout, the second circuit structure is a connection port and electrically connected to the first circuit structure through the first conductive structure.

8. The semiconductor device of claim 7, wherein the first circuit structure and the second circuit structure are electrically connected through the first conductive structure, so to form a statistic random access memory (SRAM) cell, wherein the first line terminal is a first gate line terminal, the second line terminal is a second gate line terminal.

9. The semiconductor device of claim 8, wherein the first circuit structure comprises a 6-tranststor (6T) SRAM structure, wherein the second circuit structure has a single connection port or the second circuit structure has multiple connection ports, each connection port is electrically connected to the first gate line terminal of the first circuit structure through the first conductive structure.

10. The semiconductor device of claim 8, wherein the first circuit structure further comprises a third gate line terminal, to be electrically connected to an adjacent SRAM cell, wherein the second circuit layer further comprises a second conductive structure electrically connecting the third gate line terminal of the SRAM cell and the adjacent SRAM cell.

11. The semiconductor device of claim 1, wherein the first conductive structure is a conductive plug.

12. A semiconductor apparatus, comprising:
a substrate, having a plurality of fin lines, formed by a protruding portion of the substrate, wherein the fin lines are extending along a first direction;
a plurality of gate line segments, crossing over the fin lines of the substrate, wherein the gate line segments are configured into multiple parallel lines, extending along a second direction perpendicular to the first direction; and
a conductive structure, disposed above or under adjacent two of the gate line segments, so to electrically connect the adjacent two of the gate line segments,
wherein the semiconductor apparatus is a statistic random access memory (SRAM) apparatus, comprises a plurality of SRAM cells, each SRAM cell is accordingly formed by the gate line segments, the fin lines and the conductive structure.

13. The semiconductor apparatus of claim 12, wherein each SRAM cell comprises a first circuit structure and a second circuit structure electrically connected by the conductive structure, each of the first circuit structure and the second circuit structure comprises a plurality of fin field effect transistors.

14. The semiconductor apparatus of claim 13, wherein the first circuit structure has a symmetric layout, the second circuit structure is a connection port and connected to the first circuit structure through the first conductive structure.

15. The semiconductor apparatus of claim 13, wherein the first circuit structure and the second circuit structure are electrically connected through the conductive structure, so to form a corresponding one of the SRAM cells.

16. The semiconductor apparatus of claim 13, wherein the first circuit structure comprises a 6-tranststor (6T) SRAM structure, and the second circuit structure is a single read port, having two transistors.

17. The semiconductor apparatus of claim 13, wherein the first circuit structure comprises a 6-tranststor (6T) SRAM structure, and the second circuit structure has multiple connection ports, each of the connection ports is electrically connected to the first circuit structure through the first conductive structure.

18. The semiconductor apparatus of claim 12, wherein the first conductive structure is a conductive plug.

* * * * *